US012170230B2

United States Patent
Lin et al.

(10) Patent No.: US 12,170,230 B2
(45) Date of Patent: Dec. 17, 2024

(54) METHODS OF FORMING BOTTOM DIELECTRIC ISOLATION LAYERS

(71) Applicant: Applied Materials, Inc., Santa Clara, CA (US)

(72) Inventors: SanKuei Lin, Los Gatos, CA (US); Pradeep K. Subrahmanyan, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 465 days.

(21) Appl. No.: 17/531,726

(22) Filed: Nov. 20, 2021

(65) Prior Publication Data
US 2023/0037719 A1 Feb. 9, 2023

Related U.S. Application Data

(60) Provisional application No. 63/230,806, filed on Aug. 8, 2021.

(51) Int. Cl.
| | |
|---|---|
| *H01L 21/76* | (2006.01) |
| *H01L 21/8238* | (2006.01) |
| *H01L 29/66* | (2006.01) |
| *H01L 21/768* | (2006.01) |
| *H01L 29/15* | (2006.01) |

(52) U.S. Cl.
CPC ........ *H01L 21/823807* (2013.01); *H01L 29/66545* (2013.01); *H01L 21/76829* (2013.01); *H01L 21/823878* (2013.01); *H01L 29/154* (2013.01)

(58) Field of Classification Search
None
See application file for complete search history.

(56) References Cited

U.S. PATENT DOCUMENTS

| | | | |
|---|---|---|---|
| 2017/0018624 A1 | 1/2017 | Sun et al. | |
| 2018/0082902 A1* | 3/2018 | Balakrishnan | H01L 29/401 |
| 2019/0273143 A1* | 9/2019 | Leobandung | H01L 29/401 |
| 2020/0083352 A1 | 3/2020 | Chanemougame et al. | |
| 2020/0083384 A1 | 3/2020 | Frougier et al. | |
| 2020/0365687 A1 | 11/2020 | Xie et al. | |
| 2021/0035870 A1* | 2/2021 | Young | H01L 29/78696 |
| 2021/0193797 A1 | 6/2021 | Xie et al. | |
| 2021/0234017 A1 | 7/2021 | Yao et al. | |
| 2021/0305420 A1 | 9/2021 | Frougier et al. | |
| 2022/0328482 A1* | 10/2022 | Lan | H01L 29/66795 |

OTHER PUBLICATIONS

PCT International Search Report and Written Opinion in PCT/US2022/039524 dated Nov. 28, 2022, 10 pages.

* cited by examiner

*Primary Examiner* — Joseph C. Nicely
*Assistant Examiner* — Lamont B Koo
(74) *Attorney, Agent, or Firm* — SERVILLA WHITNEY LLC (57) ABSTRACT

Embodiments of this disclosure relate to methods for removing a dummy material from under a superlattice structure. In some embodiments, after removing the dummy material, it is replaced with a bottom dielectric isolation layer beneath the superlattice structure.

15 Claims, 6 Drawing Sheets

METHODS OF FORMING BOTTOM DIELECTRIC ISOLATION LAYERS

CROSS-REFERENCE TO RELATED APPLICATIONS

This application claims priority to U.S. Provisional Application No. 63/230,806, filed Aug. 8, 2021, the entire disclosure of which is hereby incorporated by reference herein.

TECHNICAL FIELD

Embodiments of the disclosure generally relate to methods of forming bottom dielectric isolation layers. In particular, embodiments of the disclosure pertain to methods for removing a dummy material from below a superlattice structure and forming a bottom dielectric isolation layer under the superlattice structure.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

The presence of a bottom dielectric isolation (BDI) layer is becoming a major performance enhancing layer for nanosheet devices. BDI layers provide numerous benefits, including: suppressing sub-channel leakage and preventing process variations (e.g., punch-through stoppers, PTS). Accordingly, there is a need for improved methods for forming bottom dielectric isolation layers for gate-all-around devices.

SUMMARY

One or more embodiments of the disclosure are directed to a processing method for removing a dummy material. The method comprises forming a trench through a superlattice structure comprising a plurality of channel layers and a corresponding plurality of semiconductor material layers alternatingly arranged in a plurality of stacked pairs on a dummy material. The trench exposes the surfaces of the plurality of channel layers, the plurality of semiconductor material layers, and the dummy material. A liner is formed over the exposed surfaces. The liner is removed from the dummy material. The dummy material is removed without substantially affecting the channel layers and the semiconductor material layers covered by the liner.

Additional embodiments of the disclosure are directed to a processing method comprising forming a source trench and a drain trench through a superlattice structure comprising a plurality of channel layers and a corresponding plurality of semiconductor material layers alternatingly arranged in a plurality of stacked pairs on a dummy material. The source trench and the drain trench expose surfaces of the plurality of channel layers, the plurality of semiconductor material layers and the dummy material. The exposed surfaces of the plurality of channel layers are recessed to remove a depth of channel material and form a plurality of recessed channel layers. A liner is formed over the exposed surfaces of the surfaces of the plurality of recessed channel layers, the plurality of semiconductor material layers and the dummy material. The liner is conformal and has a thickness. The liner is trimmed to expose the dummy material without exposing the plurality of channel layers or the plurality of semiconductor material layers. The dummy material is removed. The liner is trimmed to expose the semiconductor material layers. A bottom dielectric isolation layer is deposited under the superlattice structure. A silicon material is deposited on the bottom dielectric isolation layer to fill the superlattice structure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

One or more embodiments of the disclosure are directed to methods of forming a bottom dielectric isolation layer. Some embodiments form a bottom dielectric isolation layer by removing a dummy material from a hGAA transistor. In some embodiments, the hGAA transistor is "built" on the dummy material, and the dummy material is removed and replaced with a bottom dielectric isolation layer.

While the disclosed dummy material is not limited to any specific material composition, the inventors have advantageously found that the disclosed embodiments enable the use of both silicon and silicon-germanium as the dummy material. Accordingly, the integration of the disclosed embodiments into existing processing schemes is advantageously simple.

Some embodiments of the disclosure are described by way of the Figures, which illustrate devices (e.g., transistors) and processes for forming transistors in accordance with one or more embodiment of the disclosure. The processes shown are merely illustrative possible uses for the disclosed processes, and the skilled artisan will recognize that the disclosed processes are not limited to the illustrated applications.

Figure 11:
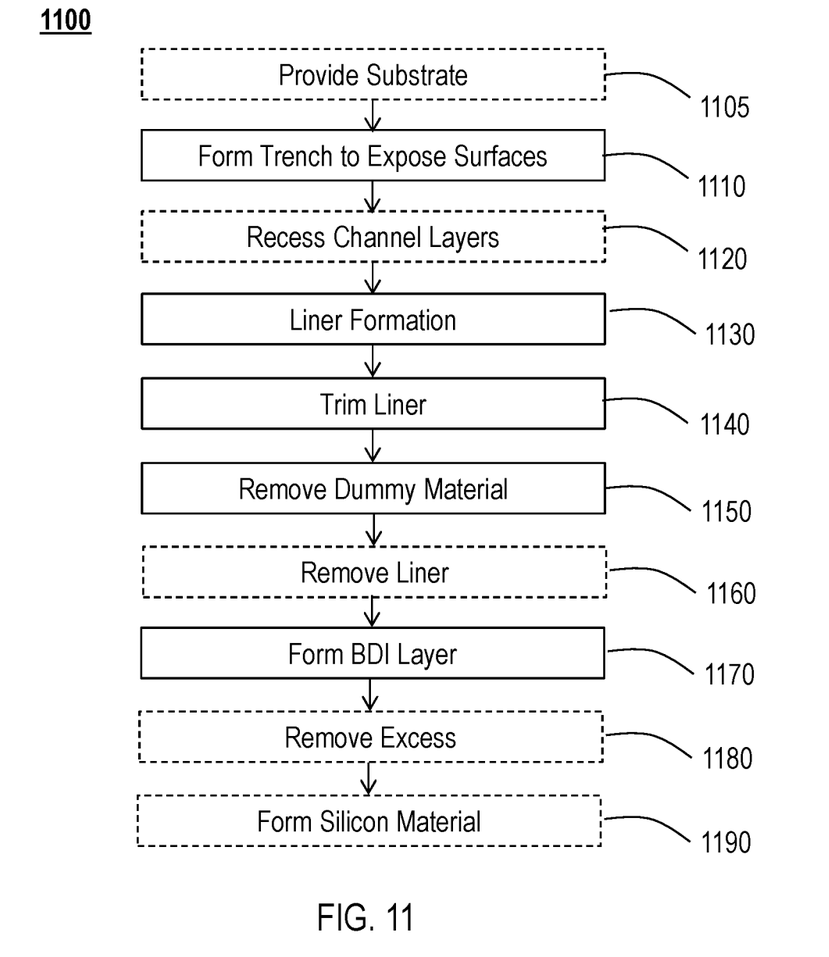
FIG. 11 illustrates a flow diagram of an exemplary method for forming a bottom dielectric isolation layer according to one or more embodiment of the disclosure.

FIGS. 1-10 depict stages of fabrication of a bottom dielectric isolation layer in accordance with some embodiments of the present disclosure. FIG. 11 illustrates a flow diagram for a method 1100 for processing a substrate in accordance with some embodiments of the present disclosure. The method 1100 is described below with respect to FIGS. 1-10.

FIGS. 1-10 are cross-sectional views of an electronic device (e.g., a GAA) according to one or more embodiment. The method 1100 may be part of a multi-step fabrication process of a semiconductor device. Accordingly, the method 1100 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

FIGS. 2-10 show the resulting changes of operation 1110 through operation 1190 in FIG. 11. Referring to FIG. 11, the method 1100 begins at optional operation 1105 by providing a substrate 102. In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 102 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 102 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

Figure 1:
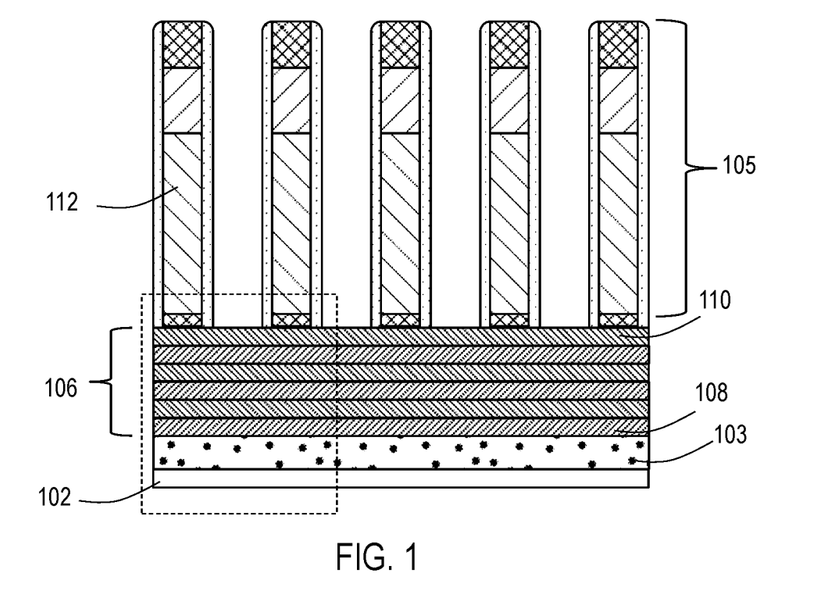
FIG. 1 illustrates an exemplary substrate before processing according to one or more embodiment of the disclosure.
Figure 2:
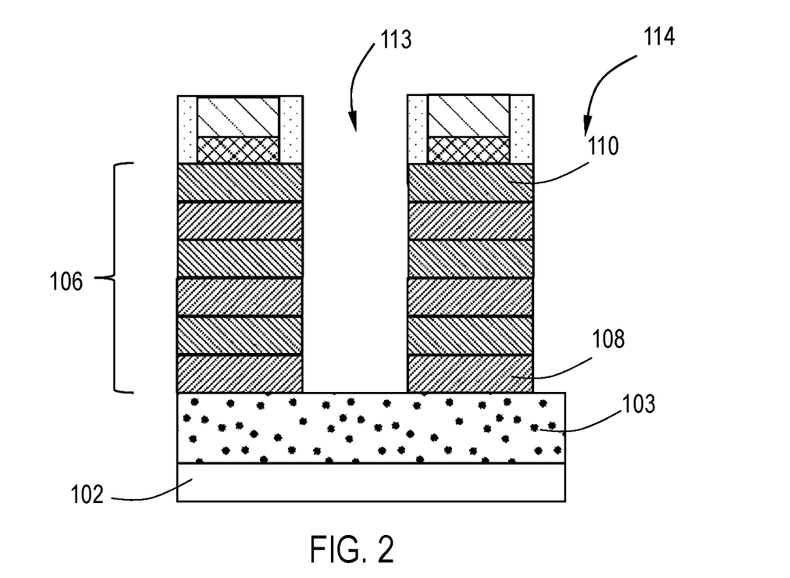
FIGS. 2-10 illustrate an expanded view of the bottom of a trench region of the exemplary substrate illustrated in FIG. 1 during processing according to one or more embodiment of the disclosure.
Figure 3:
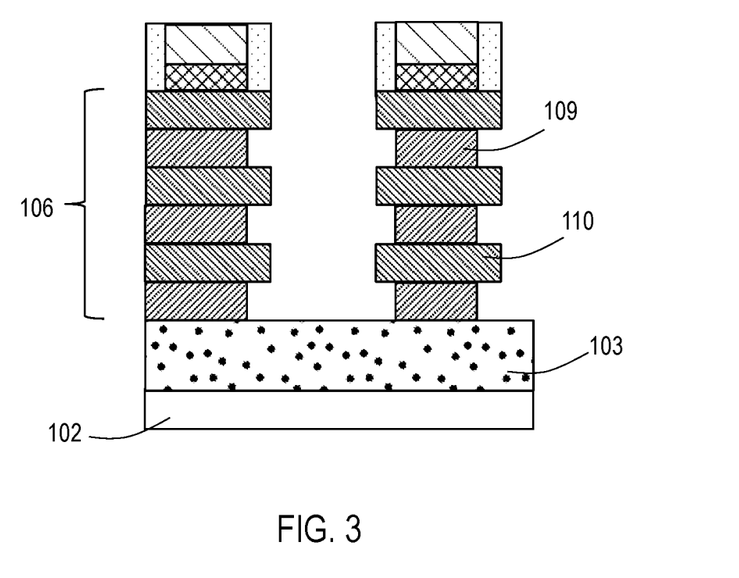
Figure 4:
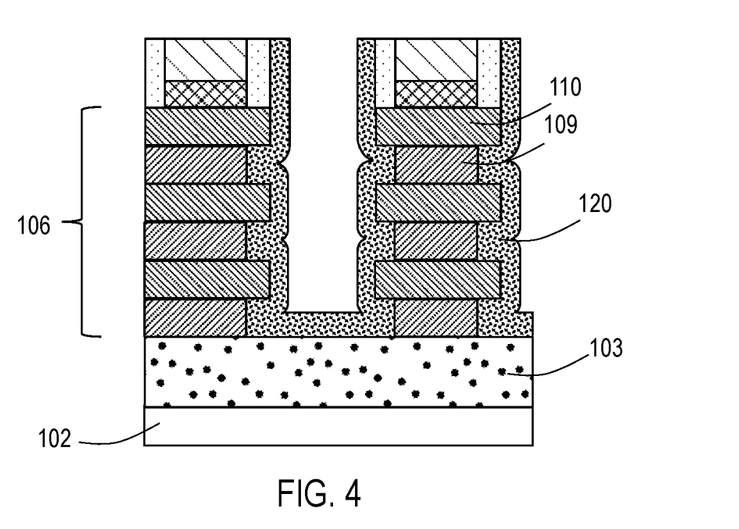
Figure 5:
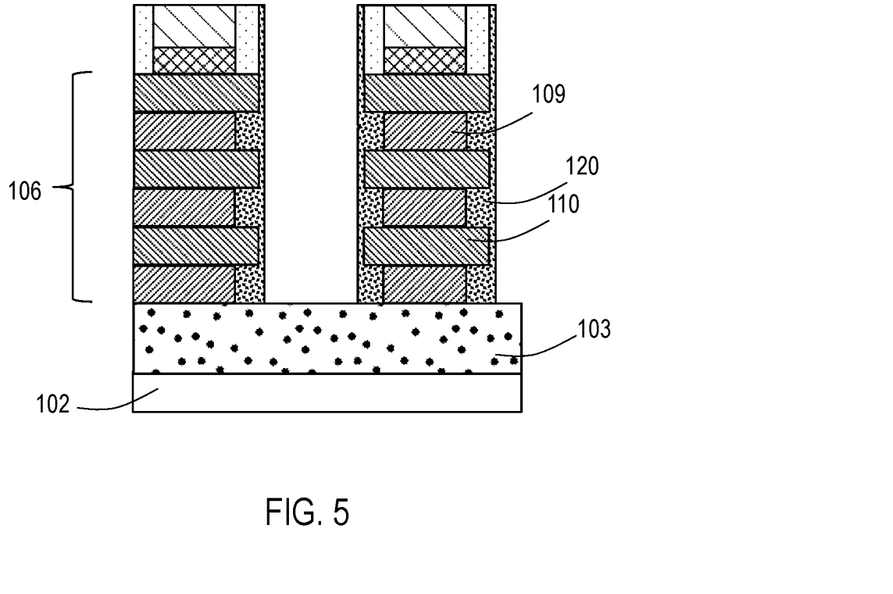
Figure 6:
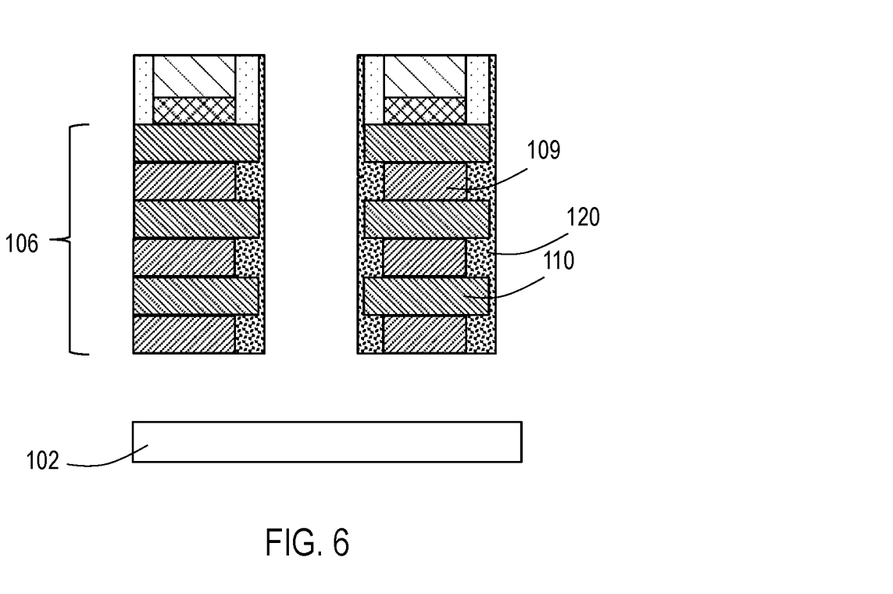

A dummy material 103 is formed on the surface of the substrate 102. In some embodiments, the dummy material 103 comprises or consists essentially of silicon (Si). In some embodiments, the dummy material 103 comprises or consists essentially of silicon-germanium (SiGe). In some embodiments, the dummy material 103 is a semiconductor material layer 110 or a channel layer 108 of the superlattice structure 106 described below.

In some embodiments, the dummy material 103 is doped with one or more of boron, phosphorous, arsenic, or germaninum. In those embodiments in which the dummy material 103 is doped, the dummy material 103 comprises a dopant concentration in a range of about 2 atomic percent to about 10 atomic percent. In some embodiments, the dummy material is formed using any suitable conventional deposition and patterning process known in the art, such as atomic layer deposition, plasma enhanced atomic layer deposition, plasma enhanced chemical vapor deposition or low-pressure chemical vapor deposition.

In some embodiments, a superlattice structure 106 is formed on the top surface of the dummy material 103. In some embodiments, the superlattice structure 106 is formed directly on the surface of the substrate 102 with the bottom layer of the superlattice structure 106 acting as the dummy material 103. In some embodiments, the superlattice structure 106 is formed directly on the surface of the substrate 102 with the second layer of the superlattice structure 106 acting as the dummy material 103. For the avoidance of doubt, the "second layer" is the layer positioned vertically adjacent to the "bottom layer"; the "bottom layer" is the layer in contact with the substrate 102.

The superlattice structure 106 comprises a plurality of semiconductor material layers 110 and a corresponding plurality of channel layers 108 alternatingly arranged in a plurality of stacked pairs. In some embodiments the plurality of stacked groups of layers comprises a silicon (Si) and silicon germanium (SiGe) group. In some embodiments, the plurality of semiconductor material layers 110 comprise silicon germanium (SiGe), and the plurality of channel layers 108 comprise silicon (Si). In other embodiments, the plurality of channel layers 108 comprising silicon germanium (SiGe), and the plurality of semiconductor materials layers comprise silicon (Si).

In some embodiments, the plurality of semiconductor material layers 110 and corresponding plurality of channel layers 108 can comprise any number of lattice matched material pairs suitable for forming a superlattice structure 106. In some embodiments, the plurality of semiconductor material layers 110 and corresponding plurality of channel layers 108 comprise from about 2 to about 50 pairs or about 3 to about 5 pairs of lattice matched materials. In some embodiments, the superlattice structure comprises 3 or 4 pairs of lattice matched materials.

In one or more embodiments, the thickness, $t_1$, of each of the plurality of semiconductor material layers 110 and the plurality of channel layers 108 are the same and in the range of from about 2 nm to about 50 nm, in the range of from about 3 nm to about 20 nm, or in a range of from about 4 nm to about 10 nm. In some embodiments, each of the plurality of semiconductor material layers 110 is in a range of about 6 nm to about 10 nm. In some embodiments, the each of the plurality of channel layers 108 is in a range of about 4 nm to about 10 nm. Accordingly, in some embodiments, a single pair of a channel layer and a semiconductor material layer has a thickness in a range of about 10 nm to about 20 nm. Further, in those embodiments where the superlattice structure comprises 3 or 4 pairs of lattice matched materials, the total thickness of the superlattice structure is in a range of about 30 nm to about 80 nm.

In some embodiments, a replacement gate structure (e.g., a dummy gate structure 105) is formed atop the superlattice structure 106. The dummy gate structure 105 defines the channel region of the transistor device. The dummy gate structure 105 may be formed using any suitable conventional deposition and patterning process known in the art. In one or more embodiments, the dummy gate structure 105 comprises one or more of titanium nitride (TiN), tantalum nitride (TaN), tungsten (W), and titanium aluminum (TiAl).

In some embodiments, sidewall spacers are formed along outer sidewalls of the dummy gate structure 105. The sidewall spacers may comprise suitable insulating materials known in the art, for example, silicon nitride, silicon oxide, silicon oxynitride, silicon carbide, or the like. In some embodiments, the sidewall spacers are formed using any suitable conventional deposition and patterning process known in the art, such as atomic layer deposition, plasma enhanced atomic layer deposition, plasma enhanced chemical vapor deposition or low-pressure chemical vapor deposition.

At operation 1110, a channel region or trench is formed to separate the superlattice structure 106 from an adjacent superlattice structure 106. In one or more embodiments, a source trench 113 and a drain trench 114 are formed adjacent (i.e., on either side) the superlattice structure 106. In some embodiments, the source trench 113 and drain trench 114 are spaced about 20 nm to about 60 nm apart. The trench exposes the surfaces of the plurality of channel layers 108, the plurality of semiconductor material layers 110, and the dummy material 103.

The source trench 113 and the drain trench 114 may be formed by any suitable process. In some embodiments, the trenches are formed by a source/drain vertical etch. In some embodiments, the etch process has high directionality which enables the vertical etch of a narrow (high aspect ratio) trench.

After forming the trench at operation 1110, in some embodiments, the method 1100 continues by optional operation 1120. At operation 1120, the plurality of channel layers 108 are recessed to remove a depth D of the material of the plurality of channel layers 108 and form a plurality of recessed channel layers 109. In some embodiments, the depth D recessed from each side of the superlattice structure 106 is in a range of about 5 nm to about 10 nm.

Recessing of the channel layers 108 may be performed by any suitable process. In some embodiments, operation 1120 is performed by a selective etch process which selectively removes the material of the plurality of channel layers 108 over the material of the plurality of semiconductor material layers 110. In some embodiments, recessing the plurality of channel layers 108 is performed by a selective etch process which preferentially removes silicon over silicon germanium.

After optionally recessing the plurality of channel layers 108, the method 1100 continues at operation 1130 by forming a liner 120 over the exposed surfaces of the plurality of (recessed) channel layers 108, the plurality of semiconductor material layers 110, and the dummy material 103 at operation 1120. The liner 120 comprises silicon nitride (SiN), silicon oxide (SiO), silicon carbide (SiC), silicon carbonitride (SiCN), silicon carbonoxynitride (SiCON), or a combination thereof. The liner 120 has a thickness L sufficient to fill any recessed portion of the plurality of recessed channel layers 108. In some embodiments, the thickness of the liner is in a range of about 3 nm to 5 nm. In some embodiments, the liner 120 is conformal, having a thickness which varies by no more than +/−10% over the surfaces of the trench. In some embodiments, the liner 120 is deposited by atomic layer deposition.

The method 1100 continues at operation 1140 by trimming the liner 120. Trimming the liner 120 at operation 1140 removes the liner 120 from the surface of the dummy material 103. Removal of the liner 120 from the surface of the dummy material 103 does not expose the plurality of channel layers 108 or the plurality of semiconductor material layers 110. In some embodiments, the liner remains continuous over the surface of the plurality of channel layers 108 and the plurality of semiconductor material layers 110. In some embodiments, a thickness of at least 1 nm or at least 2 nm remains on the plurality of channel layers 108 and the plurality of semiconductor material layers 110.

In some embodiments, removal of the liner 120 is performed by a directional etch process. In some embodiments, the liner 120 on the surfaces of the plurality of channel layers 108 and the plurality of semiconductor material layers 110 is unaffected by operation 1140. In some embodiments, the liner on the surfaces of the plurality of channel layers 108 and the plurality of semiconductor material layers 110 is thinned without exposing the surfaces of the plurality of channel layers 108 or the plurality of semiconductor material layers 110.

Method 1100 continues at operation 1150 by removing the dummy material 103. Operation 1150 can be performed by a selective etch process which is selective to the dummy material 103 over the liner 120. In some embodiments, the selective etch process is also selective to the dummy material 103 over the bottom material of the superlattice structure 106.

In some embodiments, the selective etch process comprises a wet etch process with one or more of trimethylammonium hydroxide (TMAH) or ammonium hydroxide. In some embodiments, the wet etch process comprises an oxidation and removal cycle comprising ozone and water, respectively.

Figure 7:
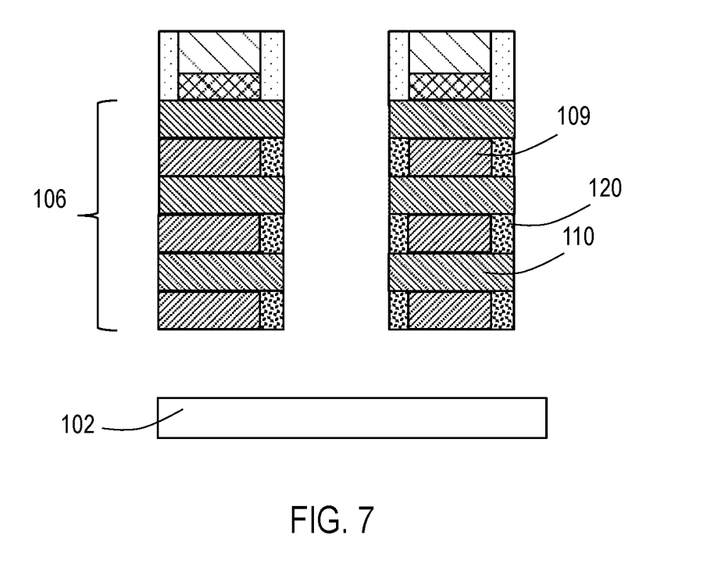

In some embodiments, the method 1100 continues with optional operation 1160. At operation 1160, the liner 120 is removed from the surface of the plurality of semiconductor material layers 110. As shown in FIG. 7, in those embodiments where the plurality of channel layers 108 is recessed, a discrete portion of the liner 120 may remain in the recessed space. Operation 1160 may comprise a wet etch process comprising one or more of phosphoric acid or acetic acid.

Next, at operation 1170, a bottom dielectric isolation layer 104 is deposited through the trenches, under the superlattice structure 106. In some embodiments, operation 1170 may be performed by a flowable deposition process, allowing the bottom dielectric isolation layer 104 to fill the space vacated by the dummy material 103.

The bottom dielectric isolation (BDI) layer 104 may comprise any suitable material known to the skilled artisan. In one or more embodiments, bottom dielectric isolation (BDI) layer 104 comprises one or more of silicon oxide ($SiO_x$), silicon nitride (SiN), silicon carbide (SiC), a combination thereof, or a high-k material. In some embodiments, the high-k material is selected from one or more of aluminum oxide ($Al_2O_3$), hafnium oxide ($HfO_2$), and the like. In one or more specific embodiments, the bottom dielectric isolation (BDI) layer 104 comprises silicon oxide.

Figure 8:
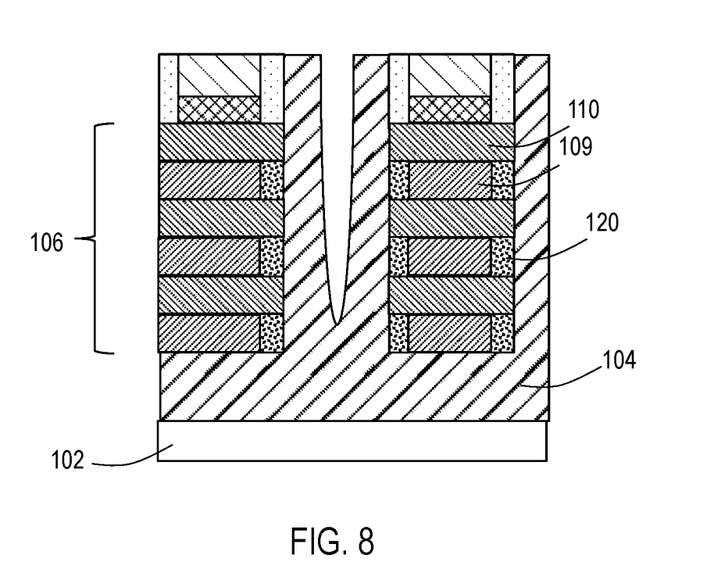
Figure 9:
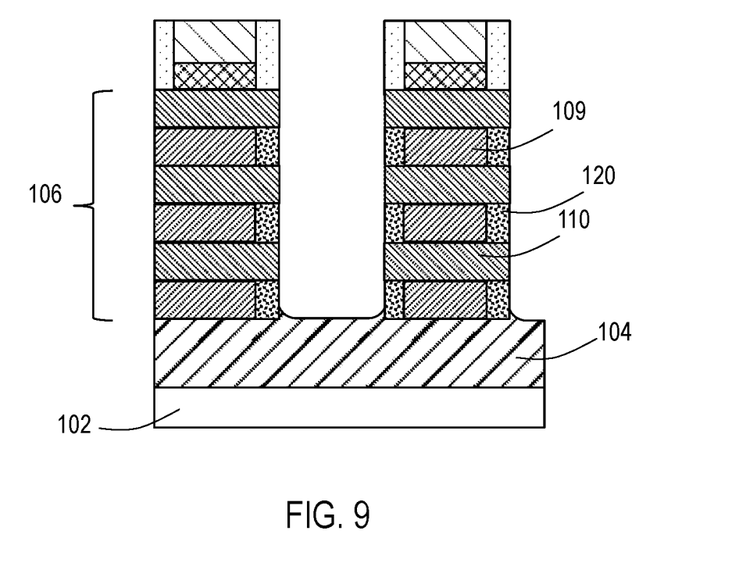
Figure 10:
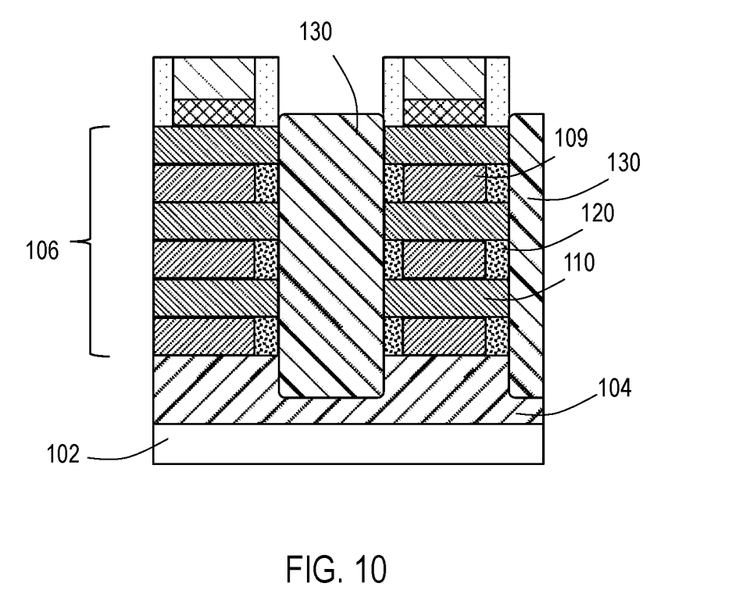

As shown in FIG. 8, In some embodiments, the bottom dielectric isolation layer 104 extends outside of the space previously occupied by the dummy material 103. As shown, in some embodiments, the material of the bottom dielectric isolation layer 104 is also deposited on the sidewalls of the trench.

For these embodiments, the method 1100 provides for removal of any excess bottom dielectric isolation layer material at operation 1180. Excess material may be removed by any suitable process.

Finally, the method 1100 concludes with optional operation 1190. At operation 1190, a silicon material 130 is deposited in the bottom dielectric isolation layer 104 to fill the superlattice structure 106. In some embodiments, the silicon material 130 is deposited epitaxially. In some embodiments, the silicon material 130 may be doped with phosphorous or boron.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method for removing a dummy material, the method comprising:
    forming a liner over a superlattice structure on a dummy material, the superlattice structure comprising a plurality of channel layers and a corresponding plurality of semiconductor material layers alternatingly arranged in a plurality of stacked pairs extending between a source trench and a drain trench, the semiconductor material layers comprising silicon (Si), the channel layers comprising of silicon-germanium (SiGe), and the dummy material comprising silicon doped with a dopant selected from one or more of boron, phosphorus, arsenic, or germanium, the concentration of dopant in a range of from 2 atomic percent to 10 atomic percent;
    removing the liner from the dummy material; and
    removing the dummy material without substantially affecting the channel layers and the semiconductor material layers covered by the liner.

2. The method of claim 1, wherein the liner comprises silicon nitride (SiN), silicon oxide (SiO), silicon carbide (SiC), or a combination thereof.

3. The method of claim 1, wherein removing the liner comprises a directional etch process.

4. The method of claim 1, wherein removing the dummy material comprises a selective etch process that is selective to the dummy material over the liner.

5. The method of claim 1, wherein removing the dummy material comprises a selective etch process that is selective to the dummy material over the channel layer or the semiconductor material layer adjacent to the dummy material.

6. The method of claim 1, further comprising depositing a bottom dielectric isolation layer beneath the superlattice structure after removing the dummy material.

7. The method of claim 6, wherein the bottom dielectric isolation layer is deposited by a flowable deposition process.

8. The method of claim 6, wherein the bottom dielectric isolation layer comprises silicon oxide.

9. A processing method comprising:
    recessing a plurality of channel layers in a superlattice structure to remove a depth of channel material and form a plurality of recessed channel layers, the superlattice structure on a dummy material, the superlattice structure comprising the plurality of channel layers and a corresponding plurality of semiconductor material layers alternatingly arranged in a plurality of stacked pairs extending between a source trench and a drain trench, the plurality of semiconductor material layers comprising silicon (Si), the plurality of channel layers comprising silicon-germanium (SiGe), and the dummy material comprising silicon doped with a dopant selected from one or more of boron, phosphorus, arsenic, or germanium, the concentration of dopant in a range of from 2 atomic percent to 10 atomic percent;
    forming a conformal liner having a thickness over the plurality of recessed channel layers, the plurality of semiconductor material layers and the dummy material;
    removing the liner from the dummy material without exposing the plurality of recessed channel layers or the plurality of semiconductor material layers;
    removing the dummy material;
    etching the liner to expose the plurality of semiconductor material layers;
    depositing a bottom dielectric isolation layer under the superlattice structure; and
    depositing a silicon material on the bottom dielectric isolation layer to fill the superlattice structure.

10. The method of claim 9, wherein a total thickness of the superlattice structure is in a range of about 30 nm to about 80 nm.

11. The method of claim 9, wherein the superlattice structure comprises 3 to 5 pairs of channel layers and semiconductor material layers.

12. The method of claim 9, wherein each of the channel layers and the semiconductor material layers has a thickness in a range of in a range of about 4 nm to about 10 nm.

13. The method of claim 9, wherein a lateral distance between the source trench and the drain trench is in a range of about 20 nm to about 60 nm.

14. The method of claim 9, wherein the depth of channel material removed from the plurality of channel layers is in a range of about 5 nm to about 10 nm.

15. The method of claim 9, wherein the thickness of the liner is in a range of about 3 nm to about 5 nm.

* * * * *